(12) United States Patent
Zannier

(10) Patent No.: US 6,366,204 B1
(45) Date of Patent: Apr. 2, 2002

(54) DEVICE FOR DETECTING A HUMAN BODY

(75) Inventor: Gian Zannier, Rivoli (IT)

(73) Assignee: Valeo Securite Habitacle, Creteil (FR)

( * ) Notice: Subject to any disclaimer, the term of this patent is extended or adjusted under 35 U.S.C. 154(b) by 0 days.

(21) Appl. No.: 09/463,467

(22) PCT Filed: May 26, 1999

(86) PCT No.: PCT/FR99/01230

§ 371 Date: Jan. 26, 2000

§ 102(e) Date: Jan. 26, 2000

(87) PCT Pub. No.: WO99/62040

PCT Pub. Date: Dec. 2, 1999

(30) Foreign Application Priority Data

May 26, 1998 (IT) ......................................... TO98A0452

(51) Int. Cl.$^7$ ............................................. G08B 13/26
(52) U.S. Cl. ....................... 340/561; 340/5.72; 340/565
(58) Field of Search .................................. 340/561, 562, 340/565, 567, 825.34, 825.31, 505, 5.72, 5.2; 307/116, 117, 10.1

(56) References Cited

U.S. PATENT DOCUMENTS

| | | | | |
|---|---|---|---|---|
| 3,774,110 A | | 11/1973 | Roveti | ...................... 324/133 |
| 3,836,828 A | * | 9/1974 | Siegel | ........................ 361/179 |
| 4,382,252 A | * | 5/1983 | Ohashi et al. | ............... 340/562 |
| 4,879,474 A | * | 11/1989 | LaMarche | ................... 307/116 |
| 5,317,620 A | * | 5/1994 | Smith | ..................... 340/567 X |
| 5,684,470 A | * | 11/1997 | DeLand et al. | ..... 340/825.31 X |
| 5,760,688 A | * | 6/1998 | Kasai | ......................... 340/561 |
| 5,929,769 A | * | 7/1999 | Garnault | .................... 340/5.61 |
| 5,986,549 A | * | 11/1999 | Teodorescu | ................. 340/561 |

* cited by examiner

Primary Examiner—Thomas Mullen
(74) Attorney, Agent, or Firm—Morgan & Finnegan, LLP

(57) ABSTRACT

A circuit for detecting presence, includes a receiver having an antenna-forming element. An oscillator receives as input the output signal from the receiver. The oscillator includes a resonant stage and an amplification stage connected to the input of the resonant stage. The oscillator is provided with a gain such the frequency of oscillation of the signal output by the oscillator is modified when an object is in the immediate proximity of the antenna-forming element of the receiver. The circuit also includes a processor for detecting a variation in the frequency of oscillation of the signal output by the oscillator and for generating an information signal representing the detection of a presence when such a frequency variation is detected.

18 Claims, 4 Drawing Sheets

DEVICE FOR DETECTING A HUMAN BODY

BACKGROUND OF THE INVENTION

The present invention relates to a circuit for detecting the presence of a human body.

BRIEF SUMMARY OF THE INVENTION

In particular, the present invention is advantageously, but not exclusively, applicable to the field of motor vehicles to enable a user to control automatic opening of the door locks of a vehicle in "hands-free" manner and without making use of a remote control that needs to be actuated by the user, and to do so specifically when the user comes close to the vehicle, and in particular when the use takes hold of the outside handle of a door.

At present, various solutions are known for detecting the presence of a person's hand. The best known solutions are based on capacitive detection, specifically on detecting a variation in the capacitance of a capacitor due to the finger of the person coming flush therewith, while others are based on proximity detection principles, e.g. making use of the Doppler effect, of light beams being interrupted, of heat being detected, etc.

Unfortunately, known solutions require circuits to be implemented that are complex and expensive and that are found to be difficult to provide in motor vehicles.

The object of the present invention is to provide a presence detection circuit which is simple and economical.

To this end, the invention proposes a circuit for detecting presence, the circuit being characterized in that it comprises:

receiver means comprising an antenna-forming element;

oscillator means receiving as input the output signal from said receiver means, the oscillator means including a resonant stage and an amplification stage connected to the input of said resonant stage and providing said oscillator means with gain such that the frequency of oscillation of the signal output by the oscillator means is modified when at least a portion of a person, e.g. the hand, is in the immediate proximity of the antenna-forming element of the receiver means; and processor means for detecting a variation in the frequency of oscillation of the signal output by the oscillator means and for generating an information signal representing the detection of a presence when such a frequency variation is detected.

This circuit is advantageously associated with the various following characteristics taken individually or in any technically feasible combination:

the amplification stage provides the oscillator with gain of the order of or greater than $10^5$, at least for a frequency lying in the range 100 Hz to 500 Hz;

an input of the amplifier stage is connected to the output of the receiver means via first resistor means, and the amplifier stage has at least one branch which is connected in parallel with said resistor means and which comprises at least three logic inverters in cascade;

the logic inverters are amplifiers constituting inverting logic gates having push-pull type output circuits;

that second resistor means are connected between the output of the receiver means and the three logic inverters in cascade;

the resistances of the first resistor means and of the second resistor means are such that at least the first logic inverter operates in non-saturated mode;

the non-saturated logic inverter(s) is/are followed by at least one pair of saturated logic inverters;

resistor means are connected in parallel with the terminals of each of the logic inverters in cascade;

the processor means include comparator means for comparing a predetermined threshold value with the mean value of a signal representative of variation in the frequency of the signal output by the amplifier stage;

the resonant stage comprises logic inverter means connected between the input and the output of said oscillator means, and capacitor and resistor means connected in series between the output of said receiver means and the output of the amplifier stage;

the processor means comprise integrator means connected to the output of the amplifier stage;

said integrator means comprise logic inverter means having an input connected to the input of said integrator means via unipolar switch means, and capacitor means connected between the input of said logic inverter means and a ground line;

said integrator means further comprise variable resistor means connected between the input of said fifth logic inverter means and said ground line;

the comparator means comprise logic inverter means having an input connected to the input of said comparator means via unipolar switch means, capacitor means connected between a power supply line and the input of said logic inverter means, and resistor means connected in series with the unipolar switch means between the input of said logic inverter means and the ground line;

the comparator means include an adaptive threshold comparator circuit; and the receiver means include means for filtering disturbances due to capacitive effects.

The invention also provides a circuit which comprises:

means for receiving an intrinsic electromagnetic field radiated by the human body;

means for amplifying and converting the electromagnetic field received by said receiver means, generating a signal having at least one parameter which is correlated with the intensity of said received electromagnetic field; and comparator means receiving as input said signal and comparing said parameter with a threshold value representative of presence being detected.

The invention also provides a system for unlocking vehicle doors, in particular car doors, the system being of the "hands-free" type and including a presence detection circuit and means for emitting an interrogation signal which are woken up when the detection circuit detects the presence of a person, said detection circuit being a presence detection circuit of the above type.

BRIEF DESCRIPTION OF THE DRAWINGS

In order to enable the present invention to be better understood, a preferred embodiment is described below by way of non-limiting example and with reference to the accompanying drawings, in which:

FIG. 1b shows an adaptive threshold circuit that can be included in the circuit of the type shown in FIG. 1a.

DETAILED DESCRIPTION OF THE INVENTION

Figure 1A:
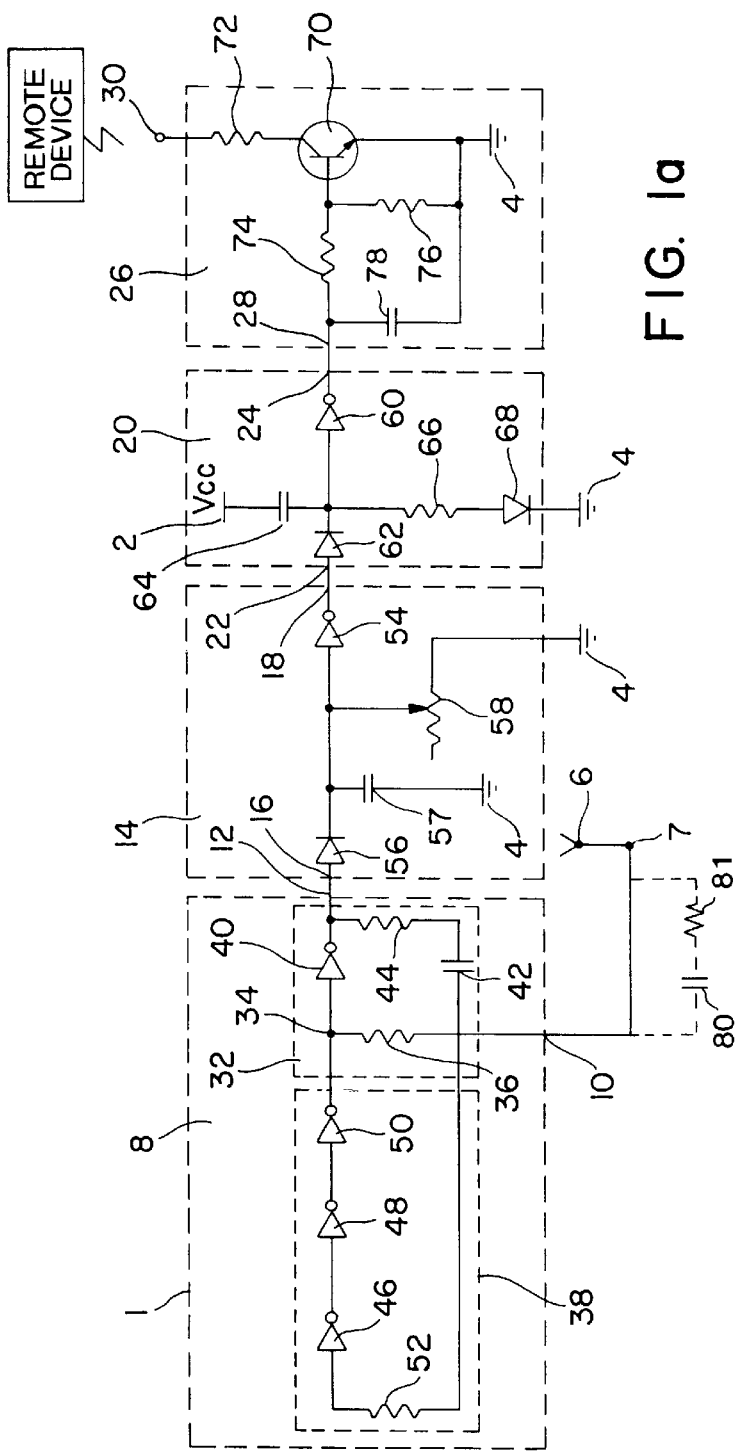
FIG. 1a is a circuit diagram of a circuit of the invention for detecting the presence of a human body.

The detection circuit shown in FIG. 1a, given overall reference 1, comprises a power supply line 2 at a predetermined reference potential $V_{cc}$; a ground line 4; receiver means mainly comprising an antenna 6 which is housed, for example, in an outside handle of the vehicle and which delivers a disturbance signal on an output 7 in a manner described in greater detail below; an oscillator circuit 8 having an input 10 connected to the output 7 from the antenna 6, and an output 12 via which said oscillator delivers an alternating type signal; an integrator circuit 14 having an input 16 connected to the output 12 of the oscillator circuit 8 and an output 18 on which said circuit 14 supplies an information signal that is likewise of alternating type; a comparator circuit 20 having an input 22 connected to the output 18 of the integrator circuit 14 and an output 24 on which said circuit delivers a logic type presence signal giving the result of the comparison between the information signal and a threshold value; and an output circuit 26 having an input 28 connected to the output 24 of the comparator circuit 20 and an output 30 on which said output circuit supplies a control signal which is used in the manner which is described below in greater detail.

The oscillator circuit 8 comprises a resonant stage 32 of conventional type having a nominal frequency of oscillation that is predetermined as a function of the values of its components, and having an input 34 connected to the input 10 by a resistor 36, and having an output connected to the output 12.

The circuit 8 also comprises a disturbance amplifier stage 38 connected between the input 10 and the input 34 of the resonant stage 32, in parallel with the resistor 36.

The purpose of this amplifier stage 38 is to inject the disturbance signal supplied by the antenna 6 directly into the resonant circuit 32 so as to give rise to an excursion in the oscillation frequency of the resonant stage 32 relative to its nominal value.

More particularly, the resonant stage 32 comprises a logic inverter 40 whose input is connected to the input 34 and whose output is connected to the output 12; said resonant stage 32 also has a capacitor 42 and a resistor 44 connected in series between the input 10 and the output 12.

By way of example, the capacitance of the capacitor 42 is 15 pF while the resistance of the resistor 44 is about 1 MΩ to 10 MΩ.

The disturbance amplifier stage 38 comprises three logic inverters 46, 48, and 50. These three inverters are connected in cascade, the output of the inverter 46 being connected to the input of the inverter 48, the output of the inverter 48 being connected to the input of the inverter 50. The input of the inverter 46 is connected via a resistor 52 to the input 10, while the output of the inverter 50 is connected to the input 34 of the resonant stage 32.

Like the logic inverter 40 of the resonant stage 32, the logic inverters 46, 48, and 50 are inverting logic gate amplifiers of push-pull output configuration. More particularly, these inverters are CD4049UB or CD4069UB logic gates.

The resistor 52 has a resistance of about 1 MΩ to 10 MΩ. The same applies to the resistor 36.

With such a circuit, the amplifier stage 38 serves to amplify with gain of $10^6$ at least some signals having a frequency in the range 100 Hz to 500 Hz, and in particular signals having a frequency lying in the range 150 Hz to 300 Hz.

Under such circumstances, because of the loop circuit provided by the resistor 36 and the resistor 52, the logic gate 46 does not operate in on/off mode, but in a linear transition mode between the two levels that its output can take up.

The gates 48 and 50 operate in their respective saturated modes.

This guarantees the above-mentioned high gain.

Other variant embodiments could also be envisaged.

In particular, the cascade circuit could have some larger number of logic gates. Under such circumstances, the gates operating in transition mode are followed by an even number of inverting logic gates that are saturated, and the gain of the circuit is very high.

The integrator circuit 14 comprises a logic inverter 54, likewise a CD4049UB or CD4069UB logic gate. The input of said inverter 54 is connected to the input 16 of the integrator circuit 14 by a diode 56, while its output is connected to the output 18 of the integrator circuit 14. A capacitor 57, e.g. having capacitance of 130 pF, is connected between the input of the logic inverter 54 and the ground line 4. A variable resistor 58 is connected in parallel with said capacitor 56. By way of example, the resistor 58 is constituted by a 680 kΩ resistor and a 47 kΩ resistor connected in series with a 2.2 MΩ resistor whose terminals are connected in parallel with a variable resistor whose resistance can vary over the range 0 to 10 MΩ.

The diode 56 conducts from the input 16 to the logic gate 54, its anode is connected to the input 16 of the integrator circuit 14, while its cathode is connected to the input of the logic inverter 54.

The comparator circuit 20 comprises a logic inverter 60 which is identical to the logic inverters 46, 48, 50, and 54, having an input connected to the input 22 of the comparator circuit 20 via a diode 62. The comparator 20 also has a capacitor 64 connected between the power supply line 2 and the input of the logic inverter 60, and a resistor 66 and a diode 68 connected in series between the input of the logic inverter 60 and the ground line 4.

More particularly, the diode 62 is connected via its anode to the input 22 of the comparator circuit 20 and via its cathode to the input of the logic inverter 60. The anode of the diode 68 is connected via the resistor 66 to the input of the logic inverter 60, and its cathode is connected to the ground line 4.

The capacitance of the capacitor 64 is 100 nF, while the resistance of the resistor 66 is 1 MΩ for example.

With the above dimensions, in particular for the capacitor 64, it is possible to ensure that when the resonant stage 32 has a frequency of oscillation that is equal to its nominal frequency of oscillation, then the input of the logic inverter 60 is placed at a predetermined voltage that is greater than the switching threshold voltage of the logic inverter 60. As a result, the presence signal present on the output of said inverter takes up a low logic level. When the resonant stage 32 takes up a frequency of oscillation equal to its own nominal frequency of oscillation, the value of the input voltage to the logic inverter 60 defines the threshold value with which the information signal provided by the integrator circuit 14 is compared, and this is described in greater detail below.

The output circuit 26 comprises a bipolar transistor 70 of NPN type having its collector terminal connected by a resistor 72 to the output 30 of the circuit 26 itself, its emitter terminal connected to the ground line 4, and its base terminal connected by a resistor 74 to the input 28 of the circuit 26 itself.

In addition, the output circuit 26 comprises a resistor 76 connected between the base terminal and the emitter terminal of the bipolar transistor 70, and a capacitor 78 placed between the input 28 of the output circuit 26 and the emitter terminal of the bipolar transistor 70.

It has been found that with circuits of the type proposed by the invention, and in particular with a circuit of the type described with reference to FIGS. 1a and 1b, a disturbance signal is generated in the resonant stage 32 via the antenna 6 and the amplifier stage 38 when a person is present in the immediate proximity of the antenna 6, and in particular when the person's hand is close to said antenna 6.

The disturbance signal injected into the resonant stage 32 by the disturbance amplifier stage 38 moves the resonant stage 32 away from its nominal frequency of oscillation; the signal output by the resonant stage 32 is then integrated by the stage 14 so as to generate an information signal associated with the frequency excursion induced by the disturbance signal; this information signal is compared in the stage 20 with a threshold value; the presence of a person's hand is detected when said information signal presents a predetermined relationship with the above-mentioned threshold value, and in particular when the frequency excursion induced by the disturbance signal is greater than or equal to a given threshold. The stage 26 then generates a corresponding signal on its output 30.

In contrast, when a person moves away from the antenna 6, no signal is observed that continues to disturb the resonant stage 32. This stage therefore generates an alternating signal on its own output that is at a frequency equal to its own nominal frequency. The signal supplied to the comparator circuit 20 is then such that the signal at the output 24 takes up a low logic level. This indicates that no person is present in the proximity of the antenna 6.

The presence signal generated by the comparator circuit 20 is thus supplied to the output circuit 26 which, by having an inverter configuration, generates a control signal on its own output 30, which control signal is likewise of the logic type and adopts the high logic level.

A theoretical explanation of the above-described operation as observed on circuits proposed by the invention is as follows.

The antenna 6 picks up radiation intrinsic to the human body, which radiation is strongly amplified by the stage 38 of the oscillator.

For example, when the hand of a person is in the immediate proximity of the outside handle in which the antenna 6 is housed, e.g. at a range of 3 cm to 5 cm therefrom, the intrinsic electromagnetic field radiated by the hand is picked up by said antenna 6, thereby generating a disturbance signal at its output which is injected into the resonant stage 32 via the disturbance amplifier stage 38.

Thereafter, the disturbance signal determines a variation in the frequency of oscillation of the resonant stage 32 relative to its nominal value, and in particular determines a reduction in the frequency of the intermediate signal present on the output of the resonant stage 32.

The excursion of the resonant stage 32 relative to its nominal frequency of oscillation determines the variation in the information signal present at the output of the integrator circuit 14, and in particular determines a reduction in its frequency and a reduction in its mean value.

In particular, the mean value of the information signal is such that it modifies the voltage at the input to the logic inverter 60 as imposed by the capacitor 64, and in particular it is such that it reduces the value of this voltage to a value that is lower than the switching threshold of the logic inverter 60.

Consequently, this reduction gives rise to a switchover in the presence signal as generated by the comparator circuit 20 going from low logic level to a high logic level, and consequently revealing the presence of a person's hand.

The presence signal generated by the comparator circuit 20 is then supplied to the output circuit 26 which generates a control signal on its own output 30 which adopts the low logic level.

This signal is then used by hands-free unlocking systems to cause the vehicle to emit a radio signal for reception by a transcoder worn or carried by the person who has put a hand on the door handle, thereby causing the transponder to emit a radio signal that carries a code enabling a processor unit in the vehicle to authenticate said person so as to activate means for locking and unlocking the doors of the vehicle. Detection by the device 1 and interchanges between the vehicle and the transponder take place sufficiently quickly for door unlocking to take place in such a manner that by the time a person authorized to enter the vehicle takes hold of the door handle, the lock of the door has already been unlocked.

Such "hands-free" unlocking systems for vehicle doors can, for example, be of the type described in the Applicants' patent applications filed in France under the numbers 95/12640 and 96/09166.

Other variant embodiments of the invention are naturally possible.

The amplifier circuit 38 and the resistor 36 can be replaced by any other amplifier circuit providing gain such that the frequency of oscillation of the signal output by the oscillator means 8 is modified when the hand of a person or some other part of the person comes into the immediate proximity of the antenna 6.

Preferably, this gain between the output of the receiver means constituted by the antenna 6 and the input 34 of the stage 32 is of the order of or greater than $10^5$, at least for a frequency lying in the range 100 Hz to 500 Hz. Devices presenting such gains have been tested and have given complete satisfaction.

Also, the receiver means can advantageously comprise, between the antenna 6 and the input 10, a 1 nF capacitor connected in series with a 2.7 M$\Omega$ resistor. The resistor and the capacitor serve to filter out disturbances to the detector circuit due to the capacitive effect. The means may also include two diodes each connected to ground in opposite directions, thereby providing the circuit with electrostatic protection.

In addition, each logic gate 46, 48, and 50 can be looped back on itself via a resistor connected in parallel with said logic gate. Looping the various logic gates serves to further increase the input gain of the resonant stage 32.

Figure 1B:
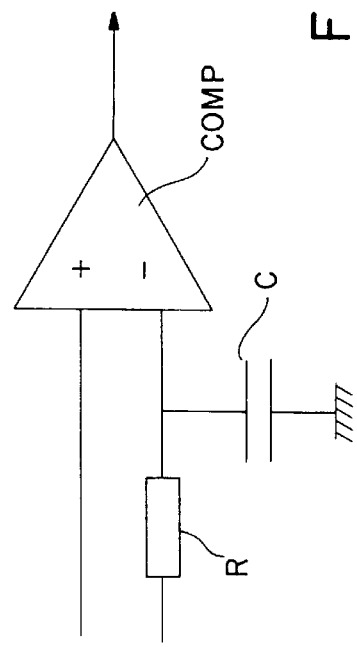

Furthermore, provision can be made between the input of the inverting gate 60 and the point common to the diode 62, the capacitor 64, and the resistor 66 for an adaptive threshold circuit of the type shown in FIG. 1b.

Such a circuit comprises a voltage comparator COMP having one input (in this case its non-inverting input) connected either directly or via a divider bridge (not shown) to the above-specified point common to the diode 62, the capacitor 64, and the resistor 66, while its other input (in this case its inverting input) is connected thereto via an RC circuit.

Because of the delay introduced by the RC circuit, the output of the comparator COMP will inject a voltage to the input of the gate 60 only when the voltage of the above-specified common point changes suddenly.

By way of example, FIGS. 2 to 7 are waveforms showing various signals within the detection circuit described with reference to FIG. 1a.

Figure 2:
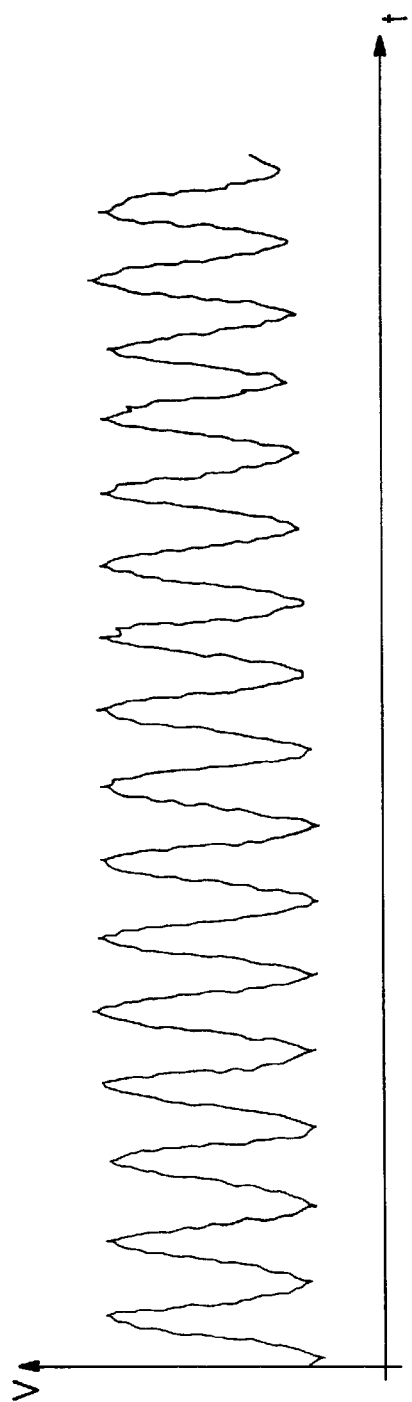
FIGS. 2 to 7 are diagrams showing the waveforms of various electrical magnitudes in the FIG. 1a detection circuit.
Figure 3:
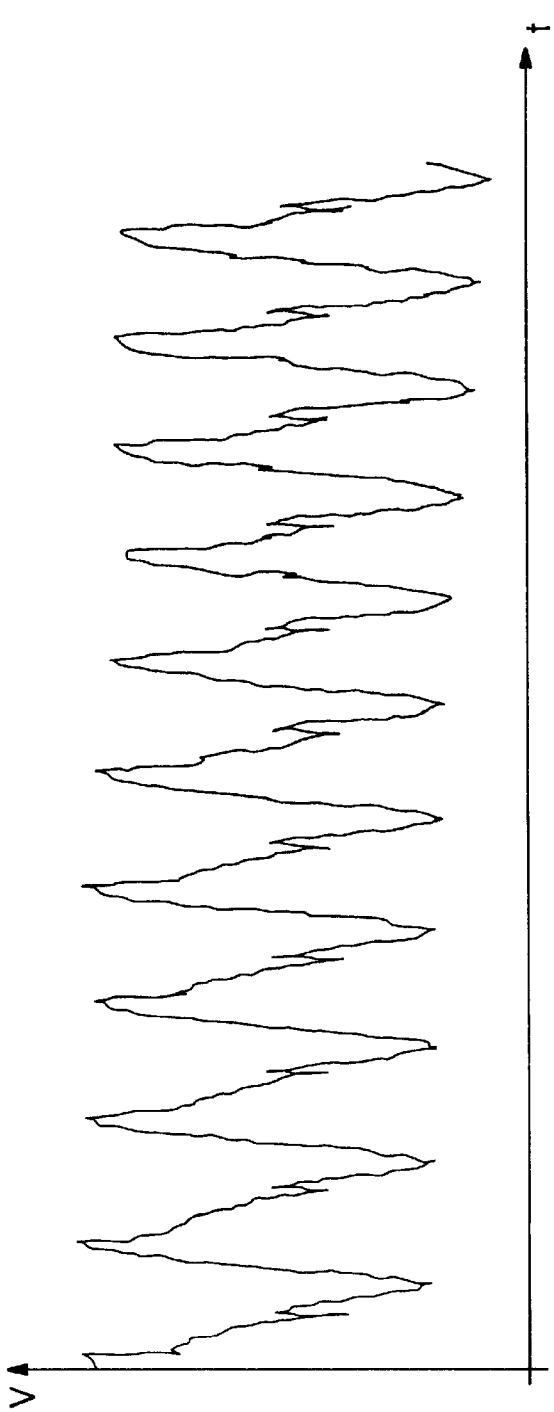

In particular, FIGS. 2 and 3 are waveforms of the signals present at the output of the logic inverter 46 of the disturbance amplifier stage 38 in the absence of a hand, and, respectively, in the presence of a hand. As can be seen, the disturbance signal injected into the oscillator circuit 8 causes the frequency of the signal to be reduced, and also distorts its waveform and increases its peak-to-peak amplitude.

Figure 4:
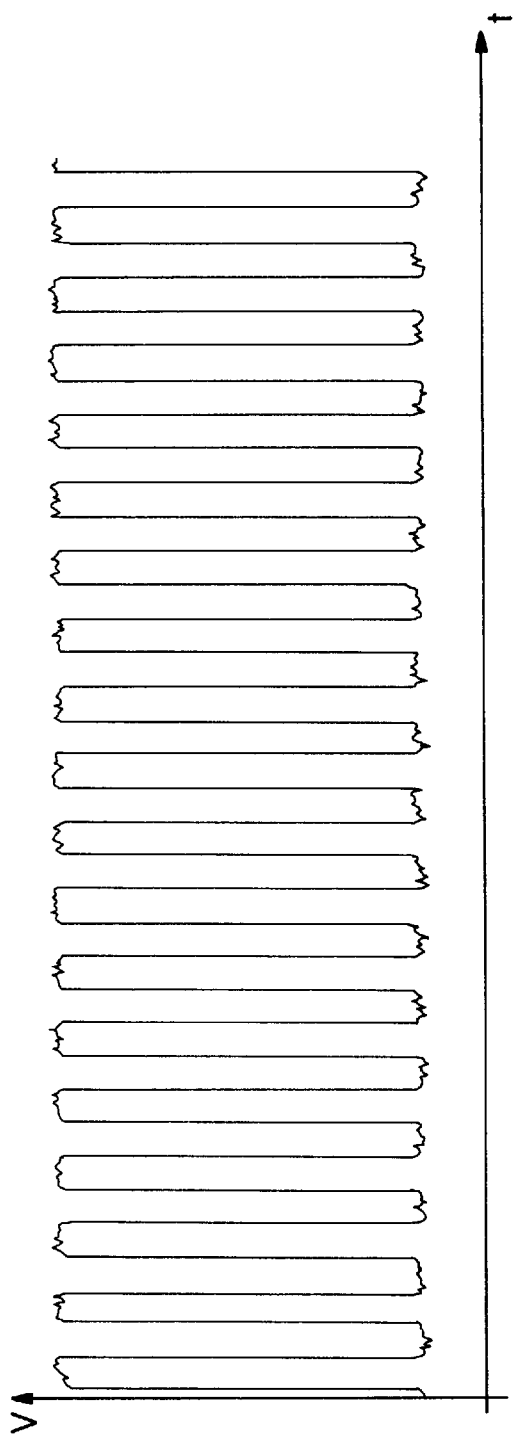
Figure 5:
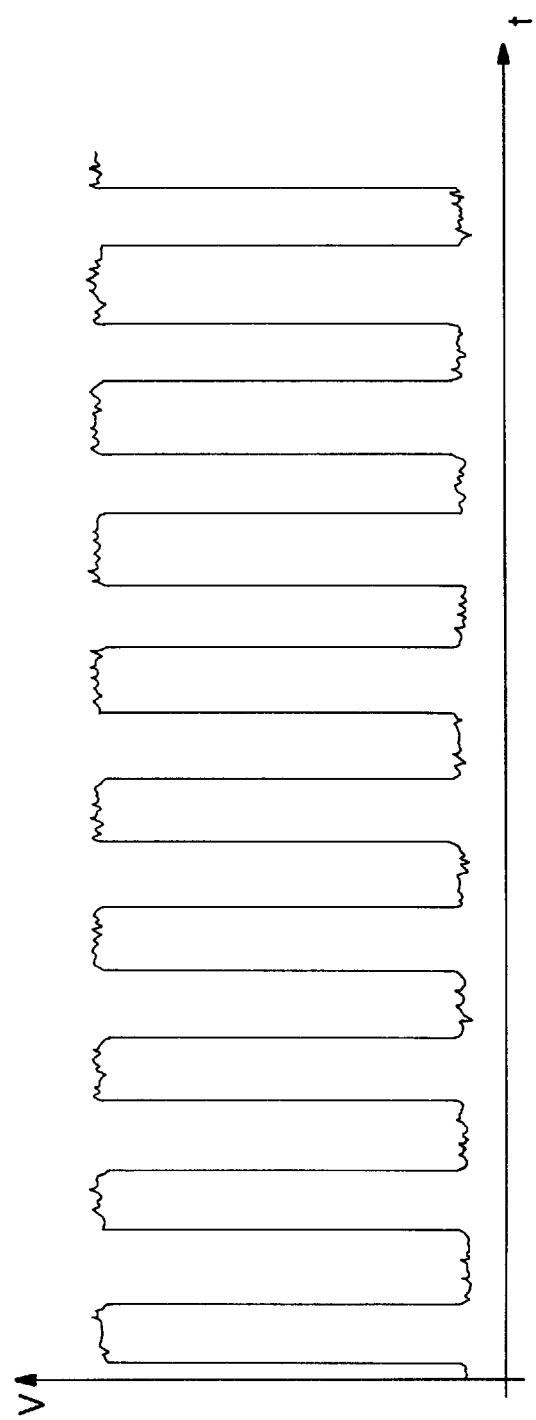

In contrast, FIGS. 4 and 5 are waveforms showing the signals present at the output 12 of the oscillator circuit 8 respectively in the absence of a hand and in the presence of a hand, and as can be seen, the disturbance signal injected in the oscillator circuit 8 serves to cause the nominal frequency of oscillation of the output signal from the resonant stage 32 to be decreased together with substantially no variation in the peak-to-peak amplitude of said signal.

Figure 6:
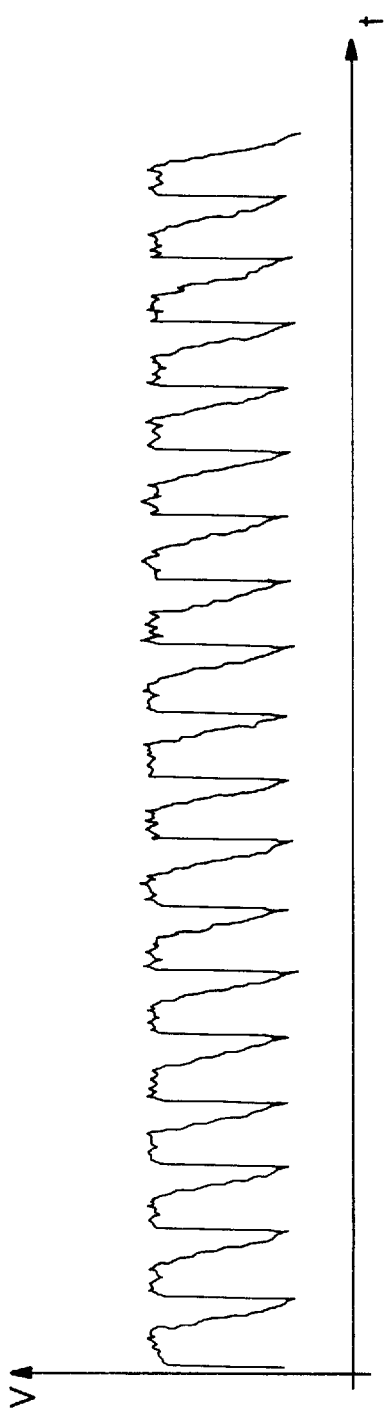
Figure 7:
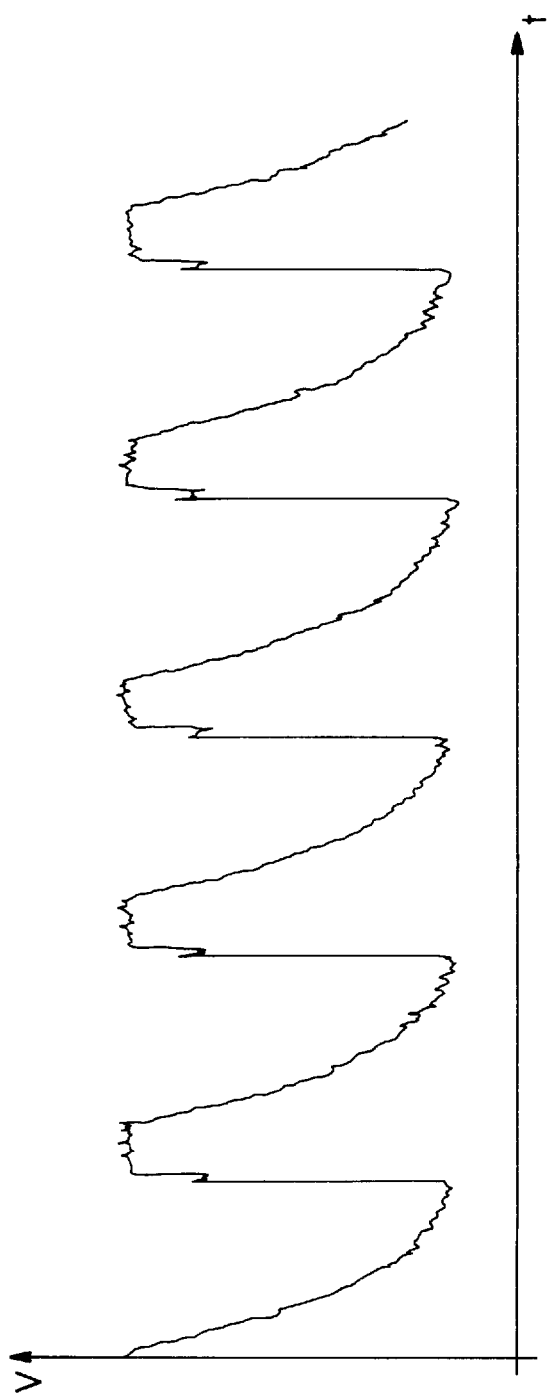

In contrast, FIGS. 6 and 7 show the waveforms of the signals present at the input of the logic inverter 60 of the integrator circuit 14 respectively in the absence of a hand and in the presence of a hand, and as can be seen, the presence of the disturbance signal gives rise to a reduction in the frequency of the signal present at the input of the logic inverter together with an increase in its peak-to-peak amplitude, and also to a variation in the waveform of said signal and to a reduction in its mean value.

An examination of the characteristics of the detection circuit 1 of the present invention shows the advantages which it makes possible.

Above all, the circuits are simple, occupying little volume and costing little, given that the circuit makes use of a limited number of electronic components that are commonly available in the trade and that consume about 150 $\mu$A, which is much less than the consumption of known detection circuits.

Furthermore, as described above, the detection circuit 1 of the present invention makes it possible to open the lock of the vehicle in a manner which is automatic when the hand of the person comes close to the outside handle of the vehicle, and it is therefore not essential to provide the vehicle with an external handle which is fitted with a lever for manually opening the lock since it suffices to make use of an outside handle of the fixed type, thereby reducing the cost of manufacturing the vehicle itself by simplifying its handle.

In addition, the detection device 1 of the present invention can be used to detect the human body or a part thereof in various other applications, such as, for example, unlocking some other automatic system of the vehicle in the presence of a portion of the human body, detecting the presence of the hands for accident-prevention purposes on machine tools (presses, shears, etc.), detecting a portion of the human body for safety purposes (vehicle theft alarms, burglar alarms for works of art, etc.), detecting the human body to control access, etc.

Finally, it is clear that modifications and variants can be made to the detection circuit and method described and shown herein, without thereby going beyond the ambit of the protection provided by the present invention.

What is claimed is:

1. A circuit for detecting presence comprising:

a receiver having an antenna-forming element;

an oscillator receiving an output signal from said receiver, said oscillator generating an output signal having a frequency of oscillation, the oscillator including a resonant stage having an input and an amplification stage coupled to the input of said resonant stage and providing said oscillator with gain such that the frequency of oscillation of the signal output by the oscillator is modified when an object is in the immediate proximity of the antenna-forming element of the receiver; and a processor for detecting a variation in the frequency of oscillation of the signal output by the oscillator and for generating an information signal representing the detection of a presence when such a frequency variation is detected.

2. A circuit according to claim 1, wherein the amplification stage provides the oscillator with gain of the order of or greater than $10^5$, at least for a frequency lying in the range 100 Hz to 500 Hz.

3. A circuit according to claim 1, wherein an input of the amplifier stage is connected to the output of the receiver via a first resistor, and wherein the amplifier stage has at least one branch which is connected in parallel with said resistor and which comprises at least three logic inverters in cascade.

4. A circuit according to claim 3 wherein the logic inverters are amplifiers comprising inverting logic gates having push-pull type output circuits.

5. A circuit according to claim 3, wherein a second resistor is connected between the output of the receiver and the three logic inverters in cascade.

6. A circuit according to claim 5, wherein the first and second resistors have resistances such that at least the first logic inverter operates in non-saturated mode.

7. A circuit according to claim 6, wherein the non-saturated logic inverter is followed by at least one pair of saturated logic inverters.

8. A circuit according to claim 3, wherein a resistor is connected in parallel with the terminals of each of the logic inverters in cascade.

9. A circuit according to claim 1, wherein the processor includes a comparator programmed to compare a predetermined threshold value with the mean value of a signal representative of variation in the frequency of the signal output by the resonant stage.

10. A circuit according to claim 9, wherein the comparator comprises a logic inverter having an input connected to the input of said comparator via a unipolar switch, a capacitor connected between a power supply line and the input of said logic inverter, and a resistor connected in series with a second unipolar switch between the input of said logic inverter and the ground line.

11. A circuit according to claim 9 wherein the comparator includes an adaptive threshold comparator circuit (R, C, COMP).

12. A circuit according to claim 1, wherein the resonant stage comprises a logic inverter connected between the input and the output of said oscillator, and a capacitor and resistor connected in series between the output of said receiver and the output of the resonant stage.

13. A circuit according to claim 1, wherein the processor comprises an integrator connected to the output of the resonant stage.

14. A circuit according to claim 13, wherein said integrator comprises a logic inverter having an input connected to the input of said integrator via a unipolar switch, and a capacitor connected between the input of said logic inverter and a ground line.

15. A circuit according to claim 14, wherein said integrator further comprise a variable resistor connected between the input of said fifth logic inverter and said ground line.

16. A circuit according to claim 1, wherein the receiver includes a capacitive filter.

17. A circuit according to claim 1, wherein the information signal includes an interrogation signal that activates a remote device when presence is detected.

18. A circuit for detecting presence, comprising:
means for receiving an intrinsic electromagnetic field radiated by a human body;
an amplifying circuit, including an amplifying stage and a resonant stage, wherein the field received by said receiver means is injected in the resonant stage via the amplifying stage for amplification and conversion, the amplifying circuit generating a signal having at least one parameter that is correlated with the intensity of said received electromagnetic field; and
a comparator, programmed to receive said signal and to compare said parameter with a threshold value representative of the presence being detected.

* * * * *